United States Patent
Prakash et al.

(10) Patent No.: US 6,353,399 B1
(45) Date of Patent: Mar. 5, 2002

(54) ROBUST ENCODING SCHEME FOR A SHIFT MOTOR ENCODER ASSEMBLY AND A SYSTEM USING THE SAME

(75) Inventors: Rajiva Prakash, Canton; Vincent Frank Amatangelo, Northville, both of MI (US)

(73) Assignee: Ford Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/686,385

(22) Filed: Oct. 11, 2000

(51) Int. Cl.[7] .................................................. H03M 1/24
(52) U.S. Cl. ............................................. 341/10; 341/8
(58) Field of Search ................................ 341/6, 7, 8, 9, 341/10, 11

(56) References Cited

U.S. PATENT DOCUMENTS

| | | |
|---|---|---|
| 3,656,573 A | 4/1972 | Halberg |
| 4,467,886 A | 8/1984 | DeClaire et al. |
| 4,718,303 A | 1/1988 | Fogelberg |
| 4,773,517 A | 9/1988 | Watanabe |
| 4,884,653 A | 12/1989 | Kouno |
| 4,961,476 A | 10/1990 | Witte et al. |
| 4,989,686 A | 2/1991 | Miller et al. |
| 4,991,678 A | 2/1991 | Furuya et al. |
| 5,032,995 A | 7/1991 | Matsuda et al. |
| 5,049,879 A * | 9/1991 | Symonds ..................... 341/10 |
| 5,060,747 A | 10/1991 | Eto |
| 5,215,160 A | 6/1993 | Williams et al. |
| 5,219,038 A | 6/1993 | Hamada et al. |
| 5,307,013 A * | 4/1994 | Santos et al. ................. 341/15 |
| 5,407,024 A | 4/1995 | Watson et al. |
| 5,461,568 A | 10/1995 | Morita |
| 5,479,348 A | 12/1995 | Sasaki |

* cited by examiner

*Primary Examiner*—Howard L. Williams
(74) *Attorney, Agent, or Firm*—Ford Global Technologies, Inc.

(57) ABSTRACT

This invention describes encoding methodology for the encoder assembly 18 which senses position of a shift motor 14 in a shift system 10. The basic motivation is robust operation of the shift system 10 in the event of an open circuit (OC) fault in the encoder output signal bus 20 or any fault in the encoder power supply line 80. It is assumed here that the controller 40 is unable to detect the said faults in a manner that is direct and independent of the sensed position code. The most important aspect of the encoding scheme is that the likely motor positions (main-stop positions) should be assigned as many logically high bits as possible. Next, no main-stop position should look like either Neutral or any of the two adjacent positions when an OC fault takes place in the bus 20. Finally, no position in the complete range of the travel of motor 14 should possess code which is identical to the power loss code (all logical zero's).

18 Claims, 2 Drawing Sheets

ROBUST ENCODING SCHEME FOR A SHIFT MOTOR ENCODER ASSEMBLY AND A SYSTEM USING THE SAME

FIELD OF THE INVENTION

This invention generally relates to a shift motor encoder assembly and more particularly, to a shift motor encoder assembly for use with a four wheel drive transfer assembly and which utilizes an improved encoding methodology which reduces the likelihood of faulty operation and malfunction.

BACKGROUND OF THE INVENTION

A four wheel drive system typically includes a transfer assembly (e.g., a "transfer case") which operatively receives a selectively rotating input shaft which receives torque from an energy source, such as an internal combustion engine, and a pair of driveshafts (e.g., a front and a rear driveshaft). The transfer assembly further includes a selectively positionable motor which selectively and movably couples or decouples the input shaft to one or both driveshafts in a desired and selected manner, with or without a gear depending upon the position of the motor or the spatial orientation of a portion of the motor, such as the shaft member.

Particularly, the motor is communicatively coupled to a controller which selectively causes the shaft or other portion of the motor to occupy a certain desired portion. The controller is further coupled to an encoder Assembly, effective to allow the controller to ascertain the motor position and other attributes of the motor. Typically, communication-between the encoder assembly and the controller occurs by the use of binary signals and the codes for various motor positions are based on a particular binary encoding methodology by design. While such methodologies or encoding schemes do allow the controller to ascertain the position of the motor, they are prone to error and prone to causing undesired malfunction or errant operation which may cause undesired damage to the transfer assembly and/or vehicle malfunction (e.g., should an error occur in the communication channels, both the encoder assembly and the controller, the controller may be errantly informed of the position of the motor and attempt to cause the motor to assume a position which may cause the vehicle to operate in an undesired manner).

SUMMARY OF THE INVENTION

It is a first object of the present invention to provide a shift motor encoder assembly and a method for utilizing the shift motor encoder assembly in a manner which overcomes some or all of the previously delineated drawbacks of prior assemblies.

It is a second object of the present invention to provide a shift motor encoder assembly and a method for utilizing the shift motor encoder assembly in a manner which overcomes some or all of the previously delineated drawbacks of prior assemblies and which employs a robust and error resistant binary encoding methodology.

It is a third object of the present invention to provide a shift motor encoder assembly and a method for utilizing the shift motor encoder assembly in a manner which overcomes some or all of the previously delineated drawbacks of prior assemblies and which causes open circuit type faults to be "visible".

It is a fourth object of the present invention to provide a shift motor encoder assembly and a method for utilizing the shift motor encoder assembly in a manner which overcomes some or all of the previously delineated drawbacks of prior assemblies and which substantially prevents a valid code from being identical to the code of any adjacent position which corresponds to a non-operational position of the motor, upon the occurrence of an open circuit type fault.

It is a fifth object of the present invention to provide a shift motor encoder assembly and a method for utilizing the shift motor encoder assembly in a manner which overcomes some or all of the previously delineated drawbacks of prior assemblies and which substantially prevents the code which is associated with the neutral position to be identical to a code which represents a main stop position with an open circuit type fault.

It is a sixth object of the present invention to provide a shift motor encoder assembly and a method for utilizing the shift motor encoder assembly in a manner which overcomes some or all of the previously delineated drawbacks of prior assemblies and which does not have any position (main stop, intermediate or rail) wit h the code identical to the power loss code.

According to a first aspect of the present invention a shift motor encoder assembly is provided and comprises an encoder which generates a code for a position of the motor having a certain number of logically high signals depending upon the likelihood that the motor will assume that position; and a controller which is communicatively coupled to the encoder and which receives the code.

According to a second aspect of the present invention a method is provided for assigning codes to main stop motor positions and a neutral position. The method includes the steps of assigning a unique code to each of the main stop motor positions and the neutral position and preventing or substantially reducing the likelihood that the neutral position code will be identical to any of the main stop motor positions upon the occurrence of an open circuit fault.

According to a third aspect of the present invention a method is provided for generating codes for use by a shift motor encoder which is operatively disposed in a four wheel drive transfer assembly. The method includes the steps of substantially preventing or substantially reducing the likelihood that, upon the occurrence of an open circuit fault, a main stop code will be identical to the code of any adjacent position.

These and other features, aspects, and advantages of the present invention will become apparent from a reading of the following detailed description of the preferred embodiment of the invention and by reference to the following drawings.

DETAILED DESCRIPTION OF THE PREFERRED EMBODIMENT OF THE INVENTION

Figure 1:
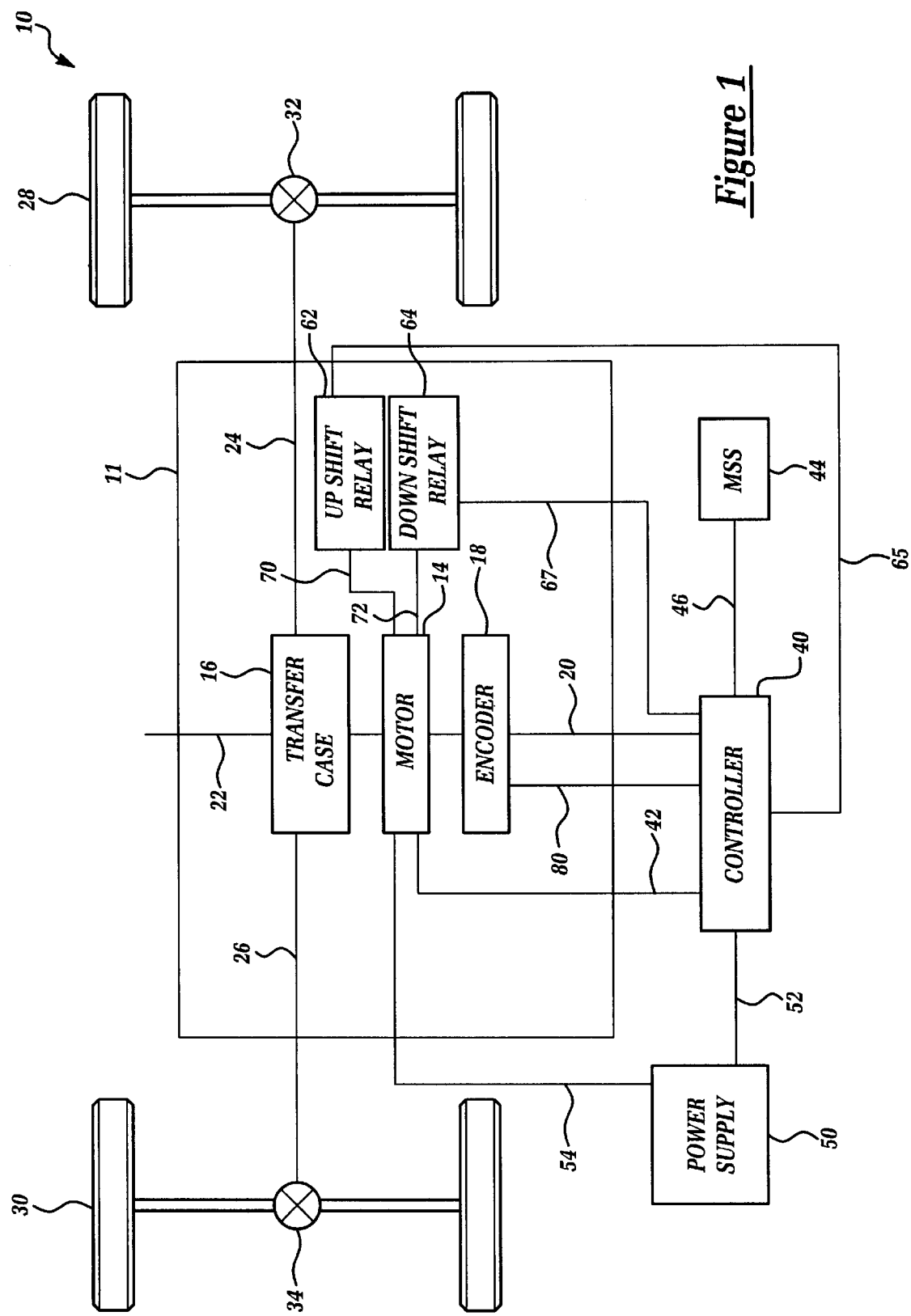
FIG. 1 is a block diagram of a four wheel drive shift system which utilizes the shift motor encoder assembly of the preferred embodiment of the invention and FIG. 2 is the schematic representation of a rotating disk of an encoder assembly corresponding to an example given to illustrate the preferred embodiment of the invention.

Referring now to FIG. 1, there is shown a four-wheel drive shift system 10 which is made in accordance with the teachings of the preferred embodiment of the invention. As shown, four wheel drive shift system 10 includes a transfer case portion or assembly 11 which includes a selectively positionable motor 14, a transfer case assembly 16, an encoder assembly, 18, an "up-shift" relay 62, and a "down-shift" relay 64. The motor 14 is operatively coupled to the assembly 16 and the assembly 16 is coupled to the torque or energy input shaft 22 and to the front and rear driveshafts 24, 26. As shown the front and rear drive shafts 24, 26 are respectively coupled to the front and rear axle assemblies 28, 30, through respective differential members 32, 24. The motor 14 therefore selectively allows energy to be transferred from the input member 22 to one of the driveshafts 24, 26 or to both of the driveshafts 24, 26 by use of the assembly 16. Each such energy transfer may be achieved with none or a particular gear ratio associated with or provided by the assembly 16. Further, the encoder assembly 18 is physically coupled to the motor 14 and senses and/or determines the position of at least a portion of the motor 14 (e.g., the shaft of the motor (not shown)) and which communicates this position information on bus 20 to the controller 40. Hence, the position of the shaft of the motor 14 determines the identity of driveshafts 24, 26 or both which are to receive torque energy as well as the gear ratio that is to be employed by the assembly 16.

Assembly 10 further includes a controller 40 which is operable under stored program control and which is communicatively and controllably coupled to the encoder assembly 18 by use of bus 20 and which is further communicatively coupled to the motor 14 by use of bus 42 effective to allow the controller 40 to sense the operating current in the motor 14. Assembly 10 also includes a mode selection switch (MSS) 44 which is physically and communicatively coupled to the controller 40 by use of bus 46 and which is adapted to allow a driver or a user of the assembly 10 to select the identity of the driveshafts 24, 26 or both to receive the torque energy and the desired gear ratio (each unique and allowable combination of a gear ratio and desired driveshaft (s) are collectively referred to as a "mode" of operation). Controller 40 and the motor 14 are each coupled to a source of energy 50, such as an electric battery, by use of respective busses 52, 54 and 80 effective to allow the energy source 50 to provide operative power to the controller 40 and to the motor 14. The encoder assembly 18 receives power through the controller 40 by bus 80. Relay assemblies 62, 64 are respectively and controllably coupled to the controller 40 by respective busses 65, 67 and to the motor 14 by respective busses 70, 72.

In operation, a desired mode is selected by use of the mode selection switch 44 and the desired operating mode is communicated to the controller 40 by bus 46. In one non-limiting embodiment of the invention, the allowable modes comprise "2L" which denotes a torque transfer to one of the two wheel assemblies 28 or 30 and a "low gear" arrangement; "4L" which denotes a torque transfer to both of the wheel assemblies 28 and 30 in a "low gear" arrangement; "2H" which denotes a torque transfer to one of the two wheel assemblies 28, 30 and a "high gear" arrangement; "4H" which denotes a torque transfer to both of the wheel assemblies 28, 30 in a "high gear" arrangement; and "N" which denotes a neutral arrangement in which the driveshafts 24, 26 are "decoupled" or disengaged from the input shaft 22. The modes of "2L", "4L", "2H", and "4H" are referred to as "main stop positions" or operably allowable positions. Each of the allowable operating modes is associated with and/or caused by a unique spatial position of the rotor of the motor 14.

Upon receipt of the desired mode signal, the controller 40 generates a signal to a selected one of the relay assemblies 62, 64, by use of respective busses 65,67 effective to cause the motor 14 to occupy the desired and required position by either "up-shifting" or "down-shifting" it should be realized that the rotor may occupy "intermediate" positions as it (i.e., the rotor) moves from a first main-stop position to a second main-stop position. The encoder assembly 18 senses the position of the motor 14 (i.e., a main-stop position, an intermediate position, or a rail position) and communicates this information, by the use of a binary type code or signal. (i.e., a signal having a certain number of bits which may respectively equal only one of two values, either a logically low or "zero" value or a logically high or "one" value) to the controller 40. This signal is produced, in one embodiment of the invention, by the use of four separate channels of information, represented by bus 20, which exists between the encoder assembly 18 and the controller 40. Each channel represents a single unique binary bit of information. The binary bit corresponding to a channel read by the controller 40 may be "near zero" voltage or "near power supply" voltage. Logic "zero" may be defined to be one of these two, i.e., "near zero" or "near power supply" and then the logic "one" will be the other one. The various bit values for each of the four channels get dynamically modified in accordance with sensed motor position as the motor moves from one main-stop to another. Each main-stop position, each intermediate position, rail position, and the neutral position has a unique code comprised of the bit values for each channel of information. In the preferred embodiment of this invention, logic "zero" is that voltage level (out of "near zero" and "near power supply") which results from an open circuit fault; accordingly, logic "one", is the other voltage level (out of the said two). In the preferred embodiment of the invention, the coding scheme or method employed to represent this "motor position" reduces the likelihood of errant operation and malfunction, and is more fully set forth below, First, it has been found that electrical open circuit type faults are much more likely to occur in the bus 20 and/or in the assembly 10 than are electrical grounded type faults. These electrical open circuit faults cause a channel of information to have a logically low value. It is therefore desirable, based upon their relatively high likelihood of occurrence, to detect open circuit type faults. Hence, in the preferred embodiment of the invention the most common motor position, corresponding to a "2H" mode, has a code comprised of all logically high bits. In this manner, an open circuit type fault will cause the associated channel to change from a logically high value to a logically low value as read by the controller 40. The next most likely motor position, corresponding to a "4H" mode, has a code comprised of almost all logically high bits (i.e., only one logically low-bit in order to distinguish this code from the code associated with the "2H" mode). The other motor main-stop positions will each have only one or at, most two logically low bits. In this manner, an open circuit fault, will cause the code associated with the "2H" mode to change thereby allowing the fault to be completely "visible" or discernible. The foregoing coding methodology further increase the likelihood that the other main-stop codes will change in response to an open circuit fault, since they each have one or two logically high values, thereby increasing the, likelihood of allowing these open circuit type faults to be visible.

Secondly, the codes are created such that an open circuit type error will not alter any of the main-stop codes to become identical to any of the respective two adjacent position codes (e.g., a change of one logically high bit value .of each of the main-stop codes do not substantially create an intermediate motor position code).

Thirdly, an open circuit type fault will not cause the codes which are associated with main-stop positions to be identical to neutral ("N") position code (i.e., a change of one logically high bit to logically low value in any main-stop code will not result in "N" code).

Finally, no code is allowed to have all logically low values as this code results from power-loss fault. That is, should encoder assembly 18 "lose power" due to a fault in bus 80; the code read by the controller 40 comprises only logically low values. Upon receipt of this code, controller 40 generates a warning signal or performs some other desirable action.

In one non-limiting embodiment of the invention, in order to reduce the amount of operating energy that is consumed or utilized by the assembly 10, the encoder 18 is deactivated after a desired motor shift is accomplished by removing power in bus 80. The controller 40 senses the motor current by use of bus 42 and utilizes this current to detect any undesired, inadvertent or "non-ordered" shifting of the motor 14 or just to confirm that motor 14 has been energized and is attempting to move.

The previously delineated four-wheel drive encoder coding scheme therefore markedly increases the robustness of the overall operation of the shift system 10 in the events of "open circuit" type errors in encoder channels (bus 20). The net result is substantial reduction of the likelihood of undesired motor movement and having transfer case 16 left at an intermediate or neutral position and of damage to the transfer case assembly 11 due to undesired shifting.

The absolute position encoder and the micro-controller that receives the information can be designed and implemented in several different ways. First of all, the encoders are of different technologies, e.g. optical, magnetic, direct contact, etc. The encoder often receives a power supply from an external source but it does not in some designs. The number of channels (output binary lines) of the encoder assembly can also be different. Finally, the controller circuitry to process the digital information of the encoder may be designed in different ways. There may be differences in designs and implementation but, in principle, the end result is the same, that is, the information associated with motor's position is transmitted to the controller via some binary signals.

The variations noted above may result in a couple of differences from system point of view. First, when a channel of the encoder is active, the controller may read that as full voltage (some "high" voltage corresponding to the power supply) or "ground" (near zero voltage) and the opposite for the inactive state of the channel. More importantly, the open circuit fault in a channel may or may not be detectable by the controller independent of the state of it (active/inactive).

Open circuit faults are of greater concern than ground faults from practical point of view. Statistically, it's more likely for a channel within the encoder assembly, the connecting wire, the connector pin, or the controller circuitry to undergo a "open" fault the short-to-ground fault. Detecting this open-circuit fault, regardless of the information contained in the signal, often causes additional complexity and cost in the controller and/or the encoder assembly. The systems that lack the said detectability are the subject of this invention. This invention has devised encoding methods for the encoder to eliminate or reduce problems in controlling the system when an open-circuit fault takes place in an encoder channel. In particular, this invention malfunction, misoperation, or damages to the vehicle and/or the shift system components.

In the following three examples, it is assumed that open-circuit (OC) fault in a channel makes that read as "0". If in a given system, the OC fault makes a channel look like a "1" then all 0's should be replaced by 1's and vice versa in these examples. It will become evident that some of most of the criteria invented in this patent ay be incorporated in a design (encoding scheme) but doing all of them, many times, is impossible. The designer makes trade-offs as in any engineering design.

EXAMPLE 1

This a simplistic 2-channel encoder. The only two main-stop positions are 2H and 4H and there are two between gear positions. The rails have the same code as the main stop positions codes.

| Position Name | Encoder Channel | |
| --- | --- | --- |
| | Channel A | Channel B |
| 2H/R1 | 1 | 1 |
| BG1 | 0 | 0 |
| BG2 | 0 | 1 |
| 4H/R2 | 1 | 0 |

Some properties and drawbacks of this coding scheme:

1. While the motor is at 2H position, if open-circuit (OC) takes place in either channel, the controller will know about it (and stop all further shifting to avoid undesirable behavior).

2. When the motor is at 4H position, if open-circuit (OC) takes place in Channel A, the controller will know about it.

3. From either 2H or 4H, no single OC fault will make the code look like the code of the next physical position. Thus, OC fault can't be confused by inadvertent rotor movement.

4. Due to the use of only two channels, the "0 0" code can't be used. Thus, Power supply failure must be detected separately.

EXAMPLE 2

This is an example with a 3-channel encoder. The motor and transfer case have all four positions, namely, 2H, 4H, and 2L with a Neutral in between 4H and 4L. The rails coincide with terminal main stops—2H and 2L.

| Position Name | Encoder Channel | | |
| --- | --- | --- | --- |
| | Channel A | Channel B | Channel C |
| 2H/R1 | 1 | 1 | 1 |
| BG1 | 0 | 0 | 1 |
| 4H | 1 | 0 | 1 |
| N | 1 | 1 | 0 |
| 4L | 0 | 1 | 0 |
| 2L/R2 | 0 | 1 | 1 |

Some properties and drawbacks of this coding scheme:

1. While at 2H, OC fault in any channel will become "visible" to the controller.

2. While at 4H, OC fault in any of A or C channels with get seen. On the other hand, while at 4L, only fault in B will be visible.

3. OC Fault in B or C will be visible while sitting at 2L.

4. While at 2H/R1 or 4L, no single OC fault will look like the adjacent code. However, while at 4H, OC in A will make it look like BG1. Also, 5. While at 2L/R2, OC fault in Channel C will create confusion with inadvertent movement to 4L.

6. No code for the physical position corresponds to the power loss code "0 0 0 0".

EXAMPLE 3

This is an example with 4 channels. The motor and transfer case have three positions, namely, 2H, 4H, and 4L with a Neutral in between 4H and 4L. The rail codes are separate from other codes.

| Position Name | Encoder Channel | | | |
|---|---|---|---|---|
| | Channel A | Channel B | Channel C | Channel D |
| R1 | 0 | 1 | 1 | 0 |
| 2H | 1 | 1 | 1 | 1 |
| BG1 | 0 | 0 | 1 | 1 |
| BG2 | 0 | 0 | 0 | 1 |
| 4H | 1 | 1 | 0 | 1 |
| BG3 | 1 | 1 | 1 | 0 |
| BG4 | 1 | 0 | 1 | 0 |
| N | 1 | 0 | 0 | 0 |
| BG5 | 0 | 1 | 0 | 1 |
| BG6 | 0 | 1 | 1 | 1 |
| 4L | 1 | 0 | 1 | 1 |
| R2 | 1 | 0 | 0 | 1 |

Some properties and drawbacks of this coding scheme:

1. From one code to adjacent one, either one or two channels change.

2. While at 2H, OC fault in any channel will become "visible" to the controller.

3. While at 4H, OC fault in only C channel will not be "visible" and, while at 4L, OC in only B channel will not be "visible".

4. While at 2H or 4H, no single OC fault will look like the adjacent code. However, while at 4L, OC in C will make it look like inadvertent movement to rail R2.

5. A single OC fault from any main-stop (2H/4H/4L) will not read as Neutral (N).

6. No code for the physical position corresponds to the power loss code "0 0 0 0". Thus, if power loss fault is not detected independently by the controller, there will be no confusion as to where the transfer case is (it can be assumed to be at the last valid encoder reading.).

Figure 2:
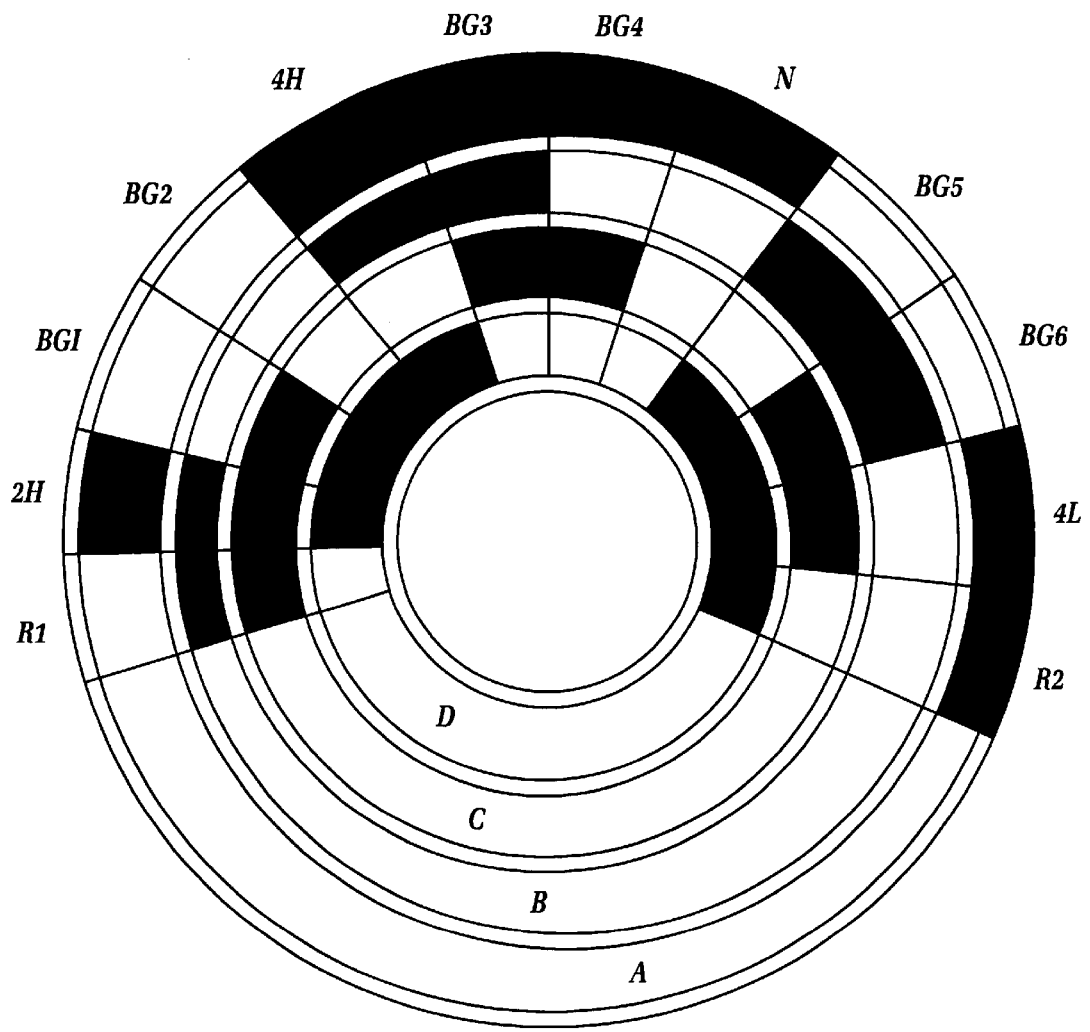

FIG. 2 is an example of the rotating disc of the encoder for this example. (It can be drawn similarly for other examples). The four tracks correspond to the four channels. The sectors on the disc correspond to the physical positions of the transfer case and the shift-motor. The shaded area on the tracks correspond to "1" and the white areas to "0".

Detailed reasoning behind the encoding criteria invented follow.

One main criterion is fewest logical "zero's" assigned to main-stop codes. Since open circuit (OC) faults are most common, one would like to protect the system against them. When the transfer case and motor are at a main stop and OC fault in an encoder channel takes place, it will be better if the system knows about it. In the absence of a direct OC fault detection mechanism, it will be desirable that the controller will "see" the fault (through the code change) so it could stop all shifting and avoid possible damages to system components and the vehicle. This is the reason that at 2H, the most common and probable position, it will be best to have all 1's as the code. That way, if there are n channels in the encoder, at least single-channel fault in (n−1) channels will be protected. Keeping in view that 2L and 4L positions are yet less probable than 4H, 2 0's will be recommended for them if one 0 is not possible.

Another criterion is that a main-stop code with an OC fault is not to be the same as adjacent codes. When sitting at a main stop, occasionally, the motor may move out of the position to the adjacent one due to bounce or other mechanical or electrical problems and in which case, it will be desirable for the controller to correct the motor position by turning it in the opposite direction (as it may be harmful to drive the vehicle in intermediate positions of the transfer case). As mentioned before, it will also be desirable if the controller can know about an OC fault so it can stop all further shifting. Combining these two requirements, we conclude that the altered code of a main-stop position due to an OC fault should not be the same as adjacent code(s). This way, the altered code due to an OC fault will be something other than an adjacent code and so the controller will know for sure that a fault has occurred and it is not inadvertent movement of motor or transfer case.

Yet another criterion is that a main-stop code with an OC fault should not be the same as a Neutral code. It is a common practice in vehicle control software design that upon ignition key on, the whole system is reset. It means, among other things, "forgetting" any previous knowledge of fault and starting afresh. Now, consider any of the two conditions named below:

(a) suppose that while sitting at a main-stop (before key was turned off last time), OC fault in an encoder channel took place and that made the code look like neutral. The controller declared an encoder fault and stopped all shifting.

(b) before key was turned off, the encoder was healthy but as the vehicle was parked, an encoder OC fault took place so the new (faulted) code was that of Neutral.

In either of these conditions, when the ignition key is turned on, the controller reads the motor position to be neutral, though in error. Since Neutral is the undesirable state to drive around (can't drive in real Neutral!) or leave the vehicle in (except with Neutral-towing), the controller will move the motor to take it out of the present position. Due to the persistent fault, some or most other codes will also be wrong and the controller will be "confused" as to where the motor is. It is clear that if Neutral reading wasn't read in the first place (upon an OC fault while motor is at a main-stop), that would be more desirable.

The final criterion for encoding is that no code in the whole range of motor motion should be the same as encoder's power loss code. The encoder code read when encoder's power supply fails is "all channels at 0". Without using this faulted encoder code, if we were to secure the information of encoder's power-loss in all possible conditions, it will take a great deal of complexity and cost. Incidentally, any of the following conditions can cause "power-failure" to the encoders (a) encoder's power line undergoing open-circuit fault.

(b) encoder's power line undergoing short-to ground fault.

(c) encoder's ground line undergoing open-circuit fault.

(d) encoder's ground line undergoing short-to-battery fault.

It's difficult to detect all these conditions. When the power-loss situation is not truly detectable by the controller, the code "0000" is the true indicator. It is important to know about the power-loss situation since if the power-failure takes place in the middle of a shifting maneuver, the controller must rail the motor on one side so that the transfer case is not left in any unknown state. It is then clear that it will be desirable not to assign the power-loss "0000" code to any main-stop, intermediate position, or rail code when designing the encoder assembly.

It should be understood that the invention is not limited to the exact construction and method which has been delineated above, but that various changes and modifications may be made without departing from the spirit and the scope of the inventions as are delineated in the following claims.

What is claimed is:

1. A shift motor encoder assembly for use with a motor which selectively occupies a plurality of positions, wherein said motor is more likely to occupy a first of said plurality of positions, said shift motor encoder assembly comprising:
   an encoder which generates a signal comprised of only logically high bit values when said motor occupies said first of said plurality of positions.

2. The shift motor encoder assembly of claim 1 wherein said likelihood of said motor occupying a second of said plurality of positions is less than said likelihood of occupying said first of said plurality of positions and wherein said encoder generates a second signal comprised of only one logically low bit value and a plurality of logically high bit values when said motor occupies said second of said plurality of positions.

3. The shift motor encoder assembly of claim 2 wherein said first of said plurality of positions comprises a 2H position.

4. The shift motor encoder assembly of claim 3 wherein said second of said plurality of position comprises a 4H position.

5. The shift motor encoder assembly of claim 4 wherein said encoder generates a third signal when said motor assumes a 4L position and said third signal comprises at most two logically low bit values.

6. The shift motor encoder assembly of claim 5 wherein said encoder generates a fourth signal comprised of at most two logically low bit values when said motor assumes a 2L position.

7. The shift motor encoder assembly of claim 1 wherein said encoder generates a fifth signal uniquely identifying said power loss.

8. The shift motor encoder assembly of claim 1 further comprising a controller which selectively deactivates said encoder when said motor is moved to a desired position.

9. A method for assigning codes to a neutral position and to main stop motor positions, said method comprising the steps of:
   assigning a code to said neutral position;
   assigning a unique code to each of said main stop motor positions; and
   preventing said code which has been assigned to said main-stop positions from being the same as a Neutral code upon the occurrence of an open circuit fault.

10. The method of claim 9 wherein said main stop motor positions comprises a 2H and a 4H position.

11. The method of claim 9 wherein said main stop motor positions comprises a 2H, 4H, and a 4L position.

12. The method of claim 9 wherein said main stop motor positions comprises a 2H, 4H, 2L, and a 4L position.

13. The method of claim 9 wherein said main stop motor positions comprise a 2H, 4H, and a 2L position.

14. A method of assigning codes to a certain main stop shift position and to intermediate motor positions which are respectively adjacent to said main stop shift position, said method comprising the steps of:
   preventing said code which has been assigned to said certain main stop shift motor position from being the same as any of said intermediate codes upon the occurrence of an open circuit fault.

15. The method of claim 14 wherein said certain position comprises a 2H position.

16. The method of claim 14 wherein said certain position comprises a 4H position.

17. The method of claim 14 wherein said certain position comprises a 2L position.

18. The method of claim 14 wherein said certain position comprises a 4L position.

* * * * *